United States Patent
Sayyah

(12) 
(10) Patent No.: US 6,287,891 B1
(45) Date of Patent: Sep. 11, 2001

(54) METHOD FOR TRANSFERRING SEMICONDUCTOR DEVICE LAYERS TO DIFFERENT SUBSTRATES

(75) Inventor: Keyvan Sayyah, Santa Monica, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 09/543,078

(22) Filed: Apr. 5, 2000

(51) Int. Cl.$^7$ .................... H01L 21/44; H01L 21/48; H01L 21/50
(52) U.S. Cl. .................. 438/106; 438/118; 438/119; 438/406; 438/455; 438/458; 438/459; 438/977
(58) Field of Search ................... 438/118, 119, 438/977, 406, 455, 458, 459

(56) References Cited

U.S. PATENT DOCUMENTS

| | | | |
|---|---|---|---|
| 4,339,870 | * 7/1982 | Ball et al. | 29/576 |
| 4,468,857 | * 9/1984 | Christian et al. | 29/577 |
| 4,826,787 | * 5/1989 | Muto et al. | 437/208 |
| 4,846,931 | 7/1989 | Gmitter et al. | 156/633 |
| 5,262,347 | * 11/1993 | Sands | 437/86 |
| 5,376,561 | * 12/1994 | Vu et al. | 437/31 |
| 5,641,381 | 6/1997 | Bailey et al. | 438/455 |
| 5,710,057 | * 1/1998 | Kenney | 437/62 |
| 5,904,545 | * 5/1999 | Smith et al. | 438/455 |
| 5,993,677 | * 11/1999 | Biasse et al. | 216/36 |
| 6,013,534 | * 1/2000 | Mountain | 438/15 |
| 6,191,008 | * 2/2001 | So | 438/459 |

* cited by examiner

Primary Examiner—Matthew Smith
Assistant Examiner—Chuong Luu
(74) Attorney, Agent, or Firm—Ladas & Parry

(57) ABSTRACT

A method for transferring layers containing semiconductor devices and/or circuits to substrates other than those on which these semiconductor devices and/or circuits have been originally fabricated. The method comprises fabricating the semiconductor devices and/or circuits, coating them with a protective layer of photoresist followed by coating with a layer of wax. A special perforated structure is then also wax coated and the waxed surface of the structure is brought into a contact with the waxed surface of photoresist. The original seed substrate is removed and the exposed surface is then coated with adhesive followed by dissolving wax through the openings in the perforated structure and attaching the layer with semiconductor devices and/or circuits to another permanent substrate. As an alternative, a disk-shaped water-soluble structure can be used instead of the perforated structure.

30 Claims, 3 Drawing Sheets

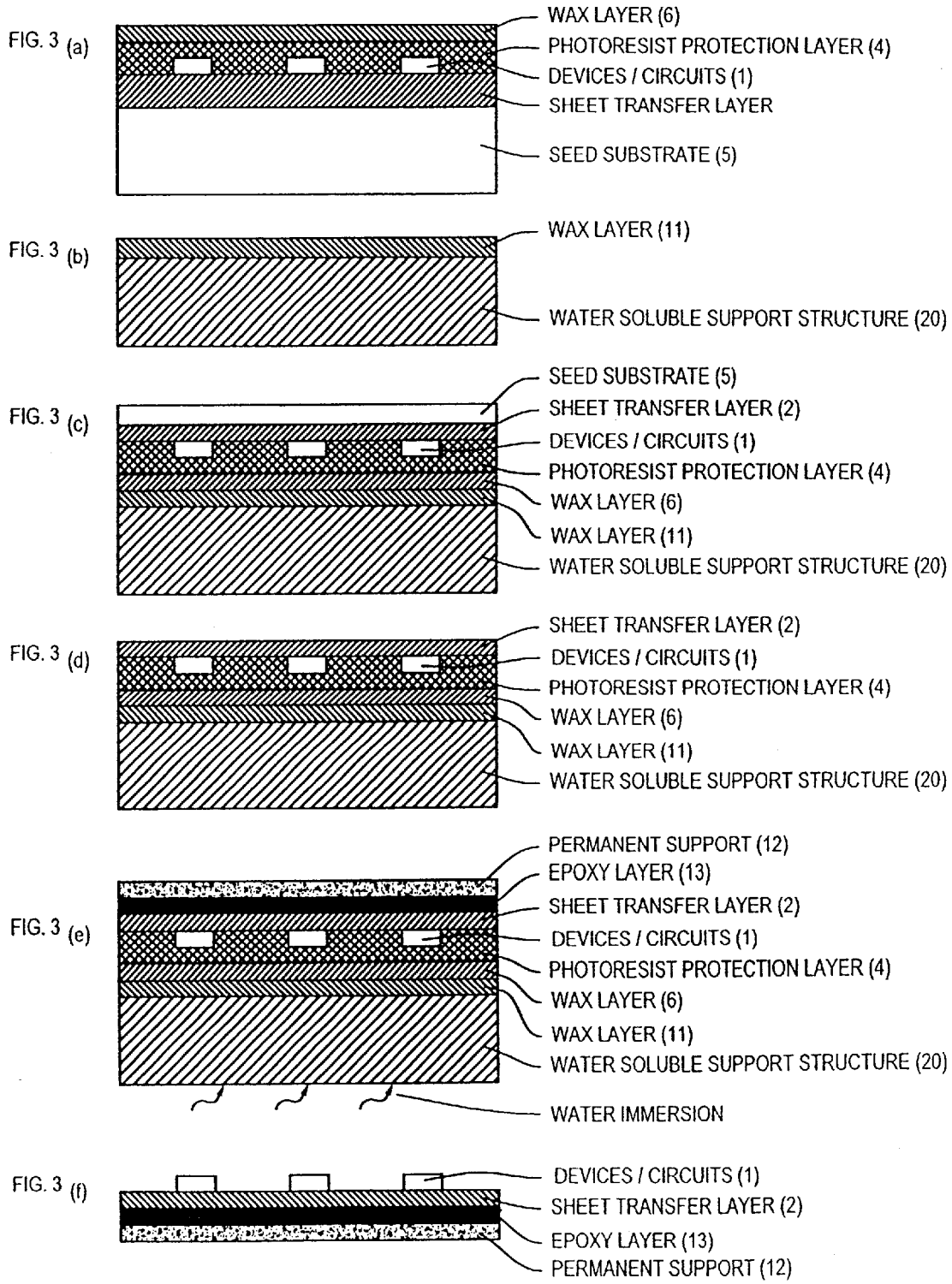

METHOD FOR TRANSFERRING SEMICONDUCTOR DEVICE LAYERS TO DIFFERENT SUBSTRATES

I. STATEMENT OF GOVERNMENT INTEREST

Figure 1:
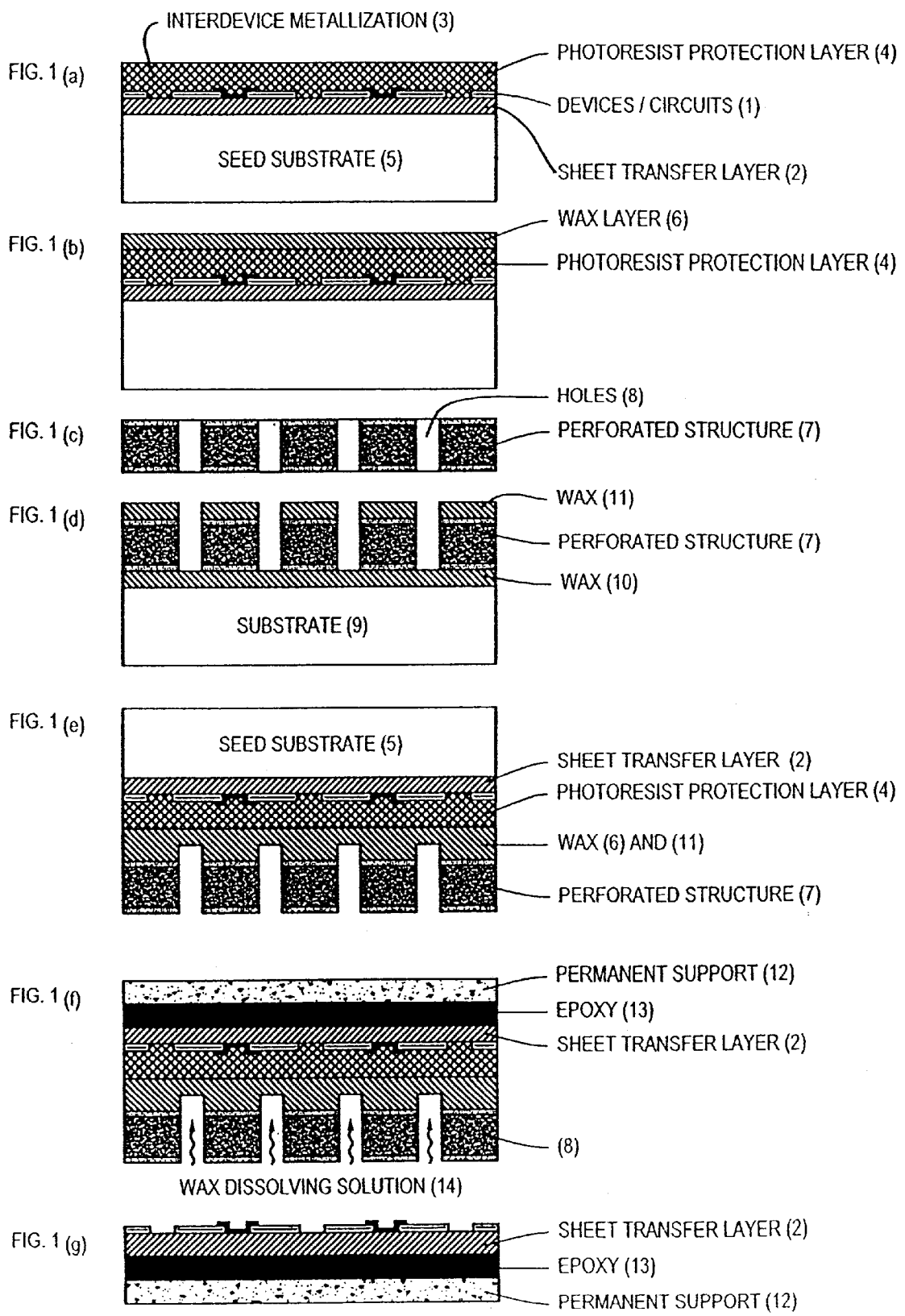

This invention was made with government support under Contract No. F33615-94-1-1414 awarded by the Defense Advanced Research Projects Agency (DARPA). The government has certain rights to this invention.

II. TECHNICAL FIELD

This invention relates to a method of transferring semiconductor devices or circuits fabricated on top of semiconductor or insulating layers as continuous sheets from one substrate to another. Semiconductor devices can be fabricated on top of the sheet layer being transferred and such semiconductor devices will, therefore, also be transferred to a different substrate.

This method of transfer results in maintaining the original registration between devices and circuits, which registration existed before the transfer because the underlying support layer is transferred as a sheet.

III. BACKGROUND OF THE INVENTION

1. Description of the Related Art

A common, well established method of transferring semiconductor devices from their original substrate to a new substrate is known as the Epitaxial Liftoff Processs (ELO) in which the devices are fabricated on top of a sacrificial release layer. The ELO method is disclosed in U.S. Pat. No. 5,641,381 to Bailey, et. al. and U.S. Pat. No. 4,846,931 to Gmitter, et. al.

According to the ELO method, by attaching the top of the semiconductor devices to an adhesive or a wax layer, the release layer is chemically etched thus releasing the devices from their original substrate. The released devices are then attached to the new substrate using another adhesive.

Both patents mentioned above teach a technique of applying a layer of a polymer or a wax on top of a device and curing this layer at specific temperature. As a result compressive stress develops in the device layer and tensile stress—in the polymer or wax layer leading to the curling up of the film as the sacrificial layer is etched away thus releasing both the device layer and the polymer/wax layer together from the substrate. The Gmitter patent is the original ELO patent and teaches this technique in general while the Bailey patent develops it further and describes specific means of removing InP layers by using a ternary InGaAs sacrificial layers.

The ELO method has serious disadvantages. It leads to a loss of the original interface between the bottom of the removed devices and the release layer which can negatively effect their ultimate electrical characteristics. This disadvantage is particularly acute if the device layer is very thin.

Other disadvantages are the difficulty in positioning the removed devices on specific locations on the new substrate to maintain registration between the devices and the inability in transferring prefabricated metallization between the devices, such as in active matrix arrays. In addition, the device layers released according to the ELO method are only supported by a thin and flexible polymer/wax layer often resulting in cracks and fractures in the thin device layer before bonding thus greatly reducing the fabrication yield.

Finally, if the devices and/or circuits on the device layer are to be electrically isolated by forming islands in the device layer prior to transfer, the registration between these devices and/or circuits will be lost if the transfer is according to the ELO technique.

The inventor is unaware of any method which overcomes the above mentioned problems associated with the ELO method. Yet there is a need for a transfer method which will:

(a) maintain the original electrical interfaces between the device layer and the layer on top of which the device layer is fabricated;

(b) maintain the original registration between the individual devices;

(c) need no special bonding layer between the bottom of each device and the new substrate; and (d) maintain electrical interconnections between individual devices prefabricated prior to transfer.

The method proposed in this inventions accomplishes all these tasks. As a result, the devices and circuits will operate under conditions identical to those prevalent at the pre-transfer stage without any need for further processing (other than deposition of light modulating or emitting layers in case of displays).

IV. SUMMARY OF THE INVENTION

The present invention is directed to a multi-step method of transferring prefabricated semiconductor devices and circuits from an original substrate to a new substrate. The gist of this method is that semiconducting or insulating layers together with semiconducting devices and circuits fabricated on top of those layers are transferred from their seed substrate to another substrate as sheets. This transfer is accomplished without removing the original underlying layer on which the devices and circuits were fabricated.

The method involves the following principal steps. The devices or circuits, including potentially metallization, are fabricated on a thin active layer and protective layer of a photoresist is applied over them. The surface of the photoresist is then coated with a thin layer of a wax, which can be applied by a variety of methods. A specially prepared perforated metallic, semiconductor or plastic structure is also coated with the same wax followed by attaching this special structure to the waxed outer surface of the photoresist in such a way that the two wax layers are fused together. An important step in this process of attachment is heating the two waxed surfaces facing each other so that wax softens up thus facilitating the fusion of the two wax layers.

After this attachment of the special perforated structure, the initial substrate upon which the devices or circuits were fabricated (the seed substrate) is etched off, either by dry etching or by wet etching, and the seed substrate is removed. The final step involves the attachment of the exposed surface of the sheet semiconducting or insulating layer, on top of which the devices or circuits are fabricated, to a new permanent substrate using an appropriate adhesive, for example, an epoxy resin. The wax is then dissolved in an appropriate solvent. The perforations in the special perforated structure play an important role greatly facilitating the removal of wax.

V. BRIEF DESCRIPTION OF THE DRAWINGS

The features and advantages of the present invention will become better understood with regard to the following description, appended claims, and accompanying drawings where FIGS. 1(a)–1(g) are diagrams schematically illustrating the process of transfer.

Figure 2:
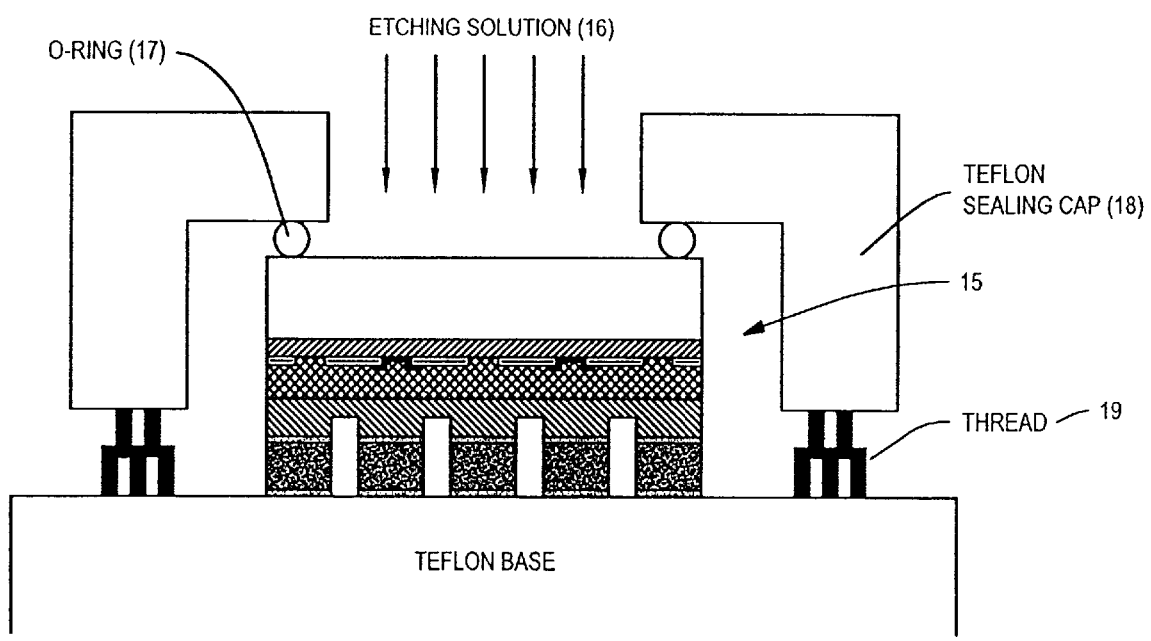

FIG. 2 is a diagram schematically illustrating a device for wet etching of a substrate.

FIGS. 3(a)–3(f) are diagrams schematically illustrating the process of transfer using an alternative non-perforated structure.

VI. DETAILED DESCRIPTION OF THE INVENTION

1. The Preferred Embodiment.

As shown by FIG. 1(a), the initial preferred step of this method is the fabrication of semiconducting devices and/or circuits 1 on a thin active layer (sheet transfer layer 2) including, if desired, interconnection metallization 3 between the devices and/or circuits, as appropriate.

Examples of the semiconducting devices and/or circuits 1 fabricated into the active layer 2 include, but are not limited to, active matrix circuitry for displays and a matrix of radiation sensing elements. Other semiconducting devices and/or circuits, including passive devices, can be also used.

Interconnection metallization 3 comprises preferably gold, or aluminum or other metal compatible with the particular semiconducting devices and/or circuits 2 used. The choice of a particular metal for interconnection metallization 3 is made according to general principles of the art of fabrication of the semiconducting devices and/or circuits 2 known to those reasonably skilled in the art. If the semiconducting devices and/or circuits 2 are to be transferred to a flexible substrate, a non-fragile, workable conductor such as gold is preferred.

The sheet transfer layer 2 is positioned on top of a seed substrate 5. The preferred seed substrate 5 is made of bonded silicon-on-insulator (BSOI), in which the buried $SiO_2$ layer forms the sheet transfer layer 2. The semiconducting devices and/or circuits 1 are fabricated in islands formed in the top of the sheet transfer layer 2, and metallization 3, if desired, is provided between the devices and/or circuits formed on top of this sheet transfer layer 2.

Alternative seed substrates 5 comprise group III-V semiconductor materials, such as gallium arsenide or indium phosphide, with a ternary intermediate layer (aluminum gallium arsenide or indium gallium arsenide) followed by a thin layer of the group III-V material. With such alternative seed substrate 5 the intermediate ternary layer should act as an etch stop when the substrate is being removed using chemical or dry etching techniques.

Following the fabrication of the devices and/or circuits 1 and any metallization 3, a layer of photoresist 4 is deposited on top of the structure as illustrated in FIG. 1(a). The preferred method of deposition of the photoresist is spinning it on, or, alternatively, spraying, followed by curing, such as by hard baking, for mechanical protection.

The photoresist 4 is baked at a temperature low enough to prevent its polymerization inhibiting its subsequent removal and high enough to remove all moisture inherently trapped in it. The preferred curing regime has been determined to be: baking at a temperature between about 130° C. and 140° C. for about 30 minutes to about 60 minutes. The preferred thickness of the layer of the photoresist 4 is between about 2 micrometers and about 5 micrometers.

This layer of photoresist 4 serves to protect the semiconducting devices and/or circuits 1 from possible mechanical damage.

Following the depositing the photoresist protection layer 4, this layer is coated with a layer of wax 6, as shown in FIG. 1(b). The wax is preferably a solid black wax, Apiezon Wax W manufactured by M&I Materials, Ltd. of Manchester, United Kingdom.

Before the wax is applied, it is dissolved in a suitable solvent, preferably, trichloroethylene (TCE), the concentration of the wax in TCE being such as to result in a viscosity of the solution of about 40 millipoise. This solution is then applied on the photoresist layer 4, preferably by spinning, and alternatively by spraying, and hard baked at temperature between about 120° C. and about 140° C. to remove the residual solvent and moisture from the wax. The baking process normally takes between about 30 minutes and about 60 minutes. The thickness of the resulting dry wax coating is preferably about 10 micrometers.

Alternatively, other chlorinated, aromatic or aliphatic solvents can be used so long as the viscosity of this resulting solution is about 40 millipoise.

Next, a perforated structure 7, shown in FIG. 1(c), having holes 8 therein is used as a temporary support while the seed substrate 5 is etched away as will be subsequently described. The perforated structure 7 is preferably made of aluminum, or, alternatively, of another metal, such as stainless steel, or a plastic, or a semiconductor material inert to a solution used to dissolve the wax layer 6 in the final step of the method described below.

The perforated structure 7 is coated with the same wax as described above, by spraying, dipping, or, preferably, spin coating, followed by baking at temperature between about 120° C. and about 140° C. to remove the residual solvent and moisture from the wax, for a period of between about 30 minutes and about 60 minutes.

The preferred method of wax-coating of the perforated structure 7 is now described with reference to FIG. 1(d). A temporary support substrate 9 is first coated, preferably by spin-coating, with a thin layer 10 of wax dissolved in a suitable solvent. The same wax and solvent as was used to make the wax layer 6 is preferably used, and is preferably applied in the same fashion as the wax layer 6. The wax coated substrate 9 is then heated to a temperature between 100° C. and 150° C. to slightly soften the wax layer 10 and to remove the solvent, preferably to 120° C.

The perforated structure 7 is then pressed onto the wax layer 10. The whole structure is then coated, preferably, spin-coated with the same wax and solvent again to cover the top surface of the perforated structure 7 with a layer of wax 11. The substrate 9 is then heated to a temperature between 100° C. and 150° C. to slightly soften the wax layer 10 and to remove the solvent, preferably to 120° C.

The perforated structure 7 is then slided off the substrate 9 after heating the wax to about 120° C. to soften it. The wax layer 11 is thus formed on the perforated structure 7.

The waxed surface 6 of the device and/or circuit substrate 5 and the waxed surface 11 of the perforated structure 7 are then brought together as shown by FIG. 1(e) and heated to a temperature between 100° C. and 150° C., preferably to 120° C., to fuse together wax layers 6 and 11 to form a structure shown on FIG. 1(e).

In the alternative, the wax layer 11 can be brought in contact with the waxed surface 6 of the device and/or circuit substrate 5 by pressing the wax layer 11 against the wax surface 6 without sliding the perforated structure 7 off the substrate 9 first. The substrate 9 can be slided off after the fusing of the two wax layers 6 and 11 has been accomplished.

Following the fusing of the two wax layers 6 and 11, the seed substrate 5 is then etched away, either by dry etching, using the deep silicon Reactive Ion Etching (REI) method, or preferably, by wet etching since the wet etching is a faster and more economical method of etching.

If a wet etching method is used, then a sample holder 15 is used and the whole structure is placed into the holder 15 as shown schematically by FIG. 2. An etching solution 16 of potassium hydroxide (KOH) in water with a preferred concentration of about 50% by weight is the preferred etching solution. The etching is conducted at a temperature preferably between 60° C. and 110° C.

Only the surface of the seed substrate 5 is exposed to the etching solution 16. Other surfaces, such as, for instance, the fused together wax layers 6 and 11 are not contacting the solution 16. The area to which the etching solution 16 is supplied is sealed. This is accomplished by the use of the O-ring 17, teflon sealing cap 18, and thread 19, as shown by FIG. 2.

After the complete separation of the seed substrate 5 in the holder 15, the sheet transfer layer 2 is exposed. A layer of an adhesive resin 13, preferably an epoxy resin, is then applied on the exposed top of the sheet transfer layer 2, as shown on FIG. 1(f). The adhesive 13 is then cured, either thermally or using the UV radiation. As an example, but not by a way of limitation, an epoxy resin Araldite 2012 manufactured by Ciba-Geigy Corp. of Basel, Switzerland may be used. The curing conditions for this resin are between about 24 and about 48 hours at room temperature.

A permanent support substrate 12 made of another semiconductor substrate, glass, or plastic is then placed on the adhesive layer 13. Glass is a preferred material for the new substrate if the transferred device is required to be rigid or the transparency to visible light is needed. Plastic is a preferred material for the new substrate if the transferred device is required to be flexible.

Any adhesive can be used as long as it does not impart a substantial tensile stress to the sheet transfer layer 2 after curing. An additional requirement to the adhesive 13 is that it must be inert to a solvent which will be subsequently used to remove the wax, as is described below.

Following the curing of the adhesive 13 applied on top of the sheet transfer layer 2 with, the wax is dissolved in an organic solvent, preferably TCE. The wax dissolving solvent 14 is applied through the holes 8, as shown on FIG. 1(f). The holes 8 accelerate the process of the wax dissolution because without the holes 8 the access of the wax dissolving solvent 14 would very slow because the exposed cross-section area (from the periphery of the structure shown on FIG. 1(f) is very small). Yet, rapid removal of the wax is important, because if it takes a long time to remove the wax, the epoxy layer 13 can be softened which will in turn lead to mechanically induced stress fracture in the sheet transfer layer 2.

After the wax is dissolved, the photoresist layer 4 is the exposed layer covering the transferred devices and circuits 1 which are on the top of the sheet transfer layer 2. The photoresist layer 4 is then removed with a solvent, preferably acetone, resulting in the exposure of the transferred devices and circuits 1, as shown on FIG. 1(g).

2. Alternative Embodiment.

In the alternative, a perforated structure 7 can be replaced by a disk-shaped water soluble support structure having no perforations and made of a water soluble material, preferably, sodium chloride or a thermoplastic polymer blend Aqua-Port manufactured by Advanced Ceramic Research, Inc. of Tucson, Ariz.

As shown by FIG. 3(a), wax layer 6 is initially applied on the surface of the photoresist protection layer 4 exactly in the same fashion as described in the preferred embodiment above. Then, a water soluble support structure 20 is coated with wax and attached to the wax layer 11 exactly in the same way as described above for the perforated structure 7 [FIG. 3(b)].

Next three steps of attaching the water soluble support structure 20 to the surface of photoresist protection layer 4 [FIG. 3(c)], of removing the seed substrate 5 [FIG. 3(d)] and of attaching a new permanent support 12 using the epoxy layer 13 [FIG. 3(d)] are exactly the same steps as described above in the description of the preferred embodiment.

But instead of using wax-dissolving solvent 14 to dislodge structure 7, the water soluble support structure 20 is submerged in water and is dissolved [FIG. 3(e)].

The entire surface of the water soluble support structure 20 is exposed to water resulting in fast and efficient removal of the water soluble support structure 20. Of course, water soluble support structure 20 could also be made from a material which can be dissolved in a solvent other than water, if desired. After such removal the exposed wax surface is exposed to TCE or another appropriate solvent resulting in the exposed devices and/or circuits 1 situated on a new permanent support 12 [FIG. 3(f)].

Having described the invention in connection with several embodiments thereof, modification will now suggest itself to those skilled in the art. As such, the invention is not to be limited to the described embodiments except as required by the appended claims.

I claim:

1. A method for transferring layers containing semiconductor devices and/or circuits to new substrates, comprising the steps of:

(a) fabricating semiconducting devices and/or circuits on a sheet transfer layer, said sheet transfer layer being located on top of a seed substrate;

(b) applying a layer of photoresist on top of said semiconducting devices and/or circuits;

(c) preparing a wax-coated surface of said layer of photoresist by coating said layer of photoresist with a layer of a wax;

(d) coating a perforated structure having holes with a layer of said wax;

(e) attaching said perforated structure to said wax-coated surface of the layer of photoresist;

(f) removing said seed substrate by etching;

(g) applying an adhesive to an exposed surface of said sheet transfer layer;

(h) attaching a new permanent substrate to a surface of said adhesive;

(i) removing said wax by applying a solvent through said holes in said perforated structure; and (j) removing said perforated structure.

2. The method according to claim 1, wherein said seed substrate comprises a bonded silicon-on-insulator and group III-V semiconductor materials.

3. The method according to claim 2, wherein said sheet transfer layer comprises a layer of silicon dioxide buried in said bonded silicon-on-insulator.

4. The method according to claim 1, wherein said semiconductor devices and/or circuits comprise an active matrix circuitry for displays and a matrix of radiation sensing elements.

5. The method according to claim 1, wherein said layer of photoresist is applied by spinning or by spraying followed by hard baking and said layer of photoresist is having thickness of between about 2 micrometers and 5 micrometers.

6. The method according to claim 5, wherein said hard baking is conducted at a temperature between about 130° C. and about 140° C. for a period of time of about 30 minutes to about 60 minutes.

7. The method according to claim 1, wherein said coating of said layer of photoresist with said layer of said wax further comprises the steps of:

(a) dissolving said wax in a solvent;

(b) applying said wax by said spinning; and (c) hard baking of said wax after said wax has been spun on.

8. The method according to claim 7, wherein said solvent comprises trichloroethylene.

9. The method according to claim 7, wherein said wax comprises the Apiezon black wax.

10. The method according to claim 7, wherein said hard baking is accomplished by heating said wax to a temperature between about 120° C. and about 140° C. until all said solvent is removed from said wax.

11. The method according to claim 1, wherein said coating of said perforated structure having said holes with said layer of said wax further comprises spin coating, spraying and dipping.

12. The method according to claim 11, wherein said spin coating of said perforated structure further comprises the steps of:

(a) dissolving said wax in a solvent;

(b) applying said wax said by spinning; and (c) hard baking of said wax after said wax is spun on.

13. The method according to claim 12, wherein said solvent comprises trichloroethylene.

14. The method according to claim 12, wherein said wax comprises the Apiezon W black wax.

15. The method according to claim 12, wherein said hard baking is accomplished by heating said wax to a temperature between about 120° C. and about 140° C. until all said solvent is removed from said wax.

16. The method according to claim 1, wherein said attaching of said perforated structure to said wax-coated surface of the layer of photoresist further comprises the steps of:

(a) coating a temporary support substrate with a layer of said wax;

(b) heating said temporary support substrate coated with said layer of said wax to a temperature of about 120° C. so that said layer of said wax is softened;

(c) pressing said perforated structure onto said wax-coated surface of said temporary support substrate;

(d) coating a top surface of said perforated structure with said wax;

(e) heating said perforated structure to a temperature of about 120° C.;

(f) sliding said perforated structure off said temporary support substrate;

(g) pressing a surface of said perforated structure coated with said wax onto said wax-coated surface of the layer of photoresist; and (h) heating said perforated structure attached to said wax-coated surface of the layer of photoresist to a temperature of about 120° C. so that said layer of said wax on said perforated structure fuse with said layer of said wax on said surface of the photoresist.

17. The method according to claim 16, wherein coating a top surface of said perforated structure with said wax comprises spinning.

18. The method according to claim 1, wherein said etching comprises a wet etching and a dry etching.

19. The method according to claim 18, wherein said wet etching is accomplished by using an etching solution of potassium hydroxide.

20. The method according to claim 19, wherein said wet etching is accomplished by using a sample holder so that only a surface of said seed substrate is exposed to said etching solution.

21. The method according to claim 19, wherein said etching solution is applied at temperatures between about 60° C. and about 110° C.

22. The method according to claim 18, wherein said dry etching is accomplished by using deep silicon reactive ion etching.

23. The method according to claim 1, wherein said adhesive comprises an epoxy resin.

24. The method according to claim 1, wherein said applying of said adhesive to said exposed surface further comprises thermal or UV-curing.

25. The method according to claim 1, wherein said new permanent substrate comprises a semiconductor substrate, a glass substrate, and a plastic substrate.

26. The method according to claim 1, wherein said solvent comprises trichloroethylene.

27. A method for transferring layers containing semiconductor devices and/or circuits to new substrates, comprising the steps of:

(a) fabricating semiconducting devices and/or circuits on a sheet transfer layer, said sheet transfer layer being located on top of a seed substrate;

(b) applying a layer of photoresist on top of said semiconducting devices and/or circuits;

(c) preparing a wax-coated surface of said layer of photoresist by coating said layer of photoresist with a layer of a wax;

(d) coating a soluble structure with a layer of said wax;

(e) attaching said soluble structure to said wax-coated surface of the layer of photoresist;

(f) removing said seed substrate by etching;

(g) applying an adhesive to an exposed surface of said sheet transfer layer;

(h) attaching a new permanent substrate to a surface of said adhesive;

(i) dissolving said soluble structure in an appropriate solvent; and (j) removing said wax by applying a solvent.

28. The method according to claim 27, wherein said soluble structure is soluble in water.

29. The method according to claim 27, wherein in said step of dissolving said soluble structure, said appropriate solvent is water.

30. The method according to claim 28, wherein said soluble structure is made of a water-soluble material comprising sodium chloride and a water-soluble thermoplastic polymer blend.

* * * * *